(12) United States Patent
Kozu

(10) Patent No.: US 6,472,713 B2
(45) Date of Patent: Oct. 29, 2002

(54) SEMICONDUCTOR DEVICE HAVING VERTICAL BIPOLAR TRANSISTOR

(75) Inventor: Toru Kozu, Kawasaki (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/892,447

(22) Filed: Jun. 28, 2001

(65) Prior Publication Data

US 2002/0000574 A1 Jan. 3, 2002

(30) Foreign Application Priority Data

Jun. 30, 2000 (JP) ........................................ 2000-199841

(51) Int. Cl.$^7$ ............................................ H01L 31/119
(52) U.S. Cl. ........................................ 257/370; 257/565
(58) Field of Search ............................... 257/587, 378, 257/586, 592, 148, 198, 201, 370, 47, 565, 273, 361, 423, 427; 438/309, 235, 205, 325, 312, 128–129, 189, 202, 565

(56) References Cited

U.S. PATENT DOCUMENTS

| | | | |
|---|---|---|---|
| 4,593,305 A | | 6/1986 | Kurata et al. |
| 5,489,799 A | * | 2/1996 | Zambrano et al. .......... 257/565 |
| 6,252,282 B1 | * | 6/2001 | Hurkx et al. ............... 257/378 |

OTHER PUBLICATIONS

U.S. patent application Ser. No. 09/892,447, filed Jun. 28,2001, pending Docket No. 210576US2S.

U.S. patent application Ser. No. 10/025,688, filed Dec. 26, 2001, pending, Docket No. 217778US2S.

* cited by examiner

Primary Examiner—Hoai Ho
Assistant Examiner—Long K. Tran
(74) Attorney, Agent, or Firm—Oblon, Spivak, McClelland, Maier & Neustadt, P.C.

(57) ABSTRACT

A semiconductor device includes a first semiconductor region, a second semiconductor region, a third semiconductor region, and a fourth semiconductor region. The first semiconductor region is a collector region of a first conductivity type. The second semiconductor region is provided on the first semiconductor region and serves as a collector region whose impurity concentration is lower than that of the first semiconductor region. The third semiconductor region is provided in the second semiconductor region and serves as a base region of a second conductivity type. The fourth semiconductor region is provided in the third semiconductor region and serves as an emitter region of the first conductivity type. The second semiconductor region is thinner than a depletion layer formed in the collector region when a potential difference between the base region and the emitter region is substantially equal to a potential difference between the collector region and the emitter region.

15 Claims, 4 Drawing Sheets

SEMICONDUCTOR DEVICE HAVING VERTICAL BIPOLAR TRANSISTOR

CROSS-REFERENCE TO RELATED APPLICATIONS

This application is based upon and claims the benefit of priority from the prior Japanese Patent Application No. 2000-199841, filed Jun. 30, 2000, the entire contents of which are incorporated herein by reference.

BACKGROUND OF THE INVENTION

1. Field of the Invention

The present invention relates to a semiconductor device and more particularly to the structure of a collector region of a vertical bipolar transistor.

2. Description of the Related Art

There is a trade-off relationship between the characteristics of the bipolar transistor, such as withstanding voltage and capacitance, and design parameters for designing the bipolar transistor. It is thus important to adopt a technique of optimizing the design parameters and designing the bipolar transistor faithfully to the design parameters.

A prior art vertical bipolar transistor will now be described with reference to FIG. 1. FIG. 1 is a cross-sectional view of a pnp bipolar transistor.

As FIG. 1 shows, a $p^+$-type buried layer 110, which serves as a collector region, is formed in an n-type silicon substrate 100. A $p^-$-type epitaxial silicon layer 120 is formed on the surface of the substrate 100. The layer 120 serves as a collector region whose concentration is lower than that of the $p^+$-type buried layer 110. An n-type diffusion layer 130, which serves as a base region, is formed in a surface area of the layer 120. A $p^+$-type diffusion layer 140, which serves as an emitter region, is formed in a surface area of the layer 130. Furthermore, two $p^+$-type diffusion layers 150, which contact the $p^+$-type buried layer 110, are formed in the $p^-$-type epitaxial silicon layer 120. The bipolar transistor is thus obtained as described above.

In the above prior art vertical bipolar transistor, a collector-to-emitter saturation voltage lowers (the impedance of the collector region lowers) without decreasing a withstanding voltage. Therefore, the collector region has a two-layer structure of the layer 110 doped with impurities to make the concentration relatively high and the layer 120 doped with impurities to make the concentration lower than that of the layer 110.

When the bipolar transistor performs a normal operation, a reversed bias is applied to a pn junction between the base and collector regions. In the above bipolar transistor, the impurity concentration of the collector region 120 is lower than that of the base region 130, so that most part of a depletion layer 160 formed at the pn junction is included in the collector region 120. The base-to-collector parasitic capacitance almost depends upon the depletion layer formed in the collector region 120. Usually, the width (thickness) DC of the collector region 120 is set greater than that Wc of the depletion layer formed in the collector region 120 by an applied voltage in the normal operation.

As described above, the base-to-collector parasitic capacitance in the prior art bipolar transistor depends upon the depletion layer formed in the collector region 120 doped with impurities to make the concentration of the collector region relatively low. The depletion layer is formed widely and thus the parasitic capacitance is limited to a relatively small value.

Since, however, the impurity concentration of the collector region 120 is low, the dependence of the width of the depletion layer upon the applied voltage increases. In other words, the width of the depletion layer is greatly varied with a voltage applied between the base and collector, as is the parasitic capacitance. When an oscillation circuit is formed using such a bipolar transistor, the base-to-collector parasitic capacitance is greatly changed with the applied voltage, and thus the oscillation frequency of the oscillation circuit is widely varied (pushing).

The collector region of the prior art vertical bipolar transistor has the two-layer structure described above. The structure includes the collector region 110 doped with impurities to make the concentration of the region 110 high and the collector region 120 doped with impurities to make the concentration of the region 120 low and connected to the base region. The low-impurity-concentration collector region 120 is formed more widely than the depletion layer generated by the voltage applied in the normal operation and most of the region 120 is formed in the collector region due to a difference in impurity concentration. The base-to-collector parasitic capacitance therefore depends upon the depletion layer formed in the low-impurity-concentration collector region 120, and the depletion layer is formed widely. The parasitic capacitance is limited to a relatively small value. However, the width of the depletion layer is widely varied with the voltage applied between the base and collector and thus the parasitic capacitance varies greatly. Further, when an oscillation circuit is formed using the above prior art bipolar transistor, the base-to-collector parasitic capacitance is greatly changed with the applied voltage and thus the parasitic capacitance is greatly varied, with the result that the oscillation frequency of the oscillation circuit is widely varied.

BRIEF SUMMARY OF THE INVENTION

The present invention has been developed in consideration of the above situation and an object thereof is to provide a semiconductor device capable of suppressing variations of the width of a depletion layer due to an applied voltage while reducing the parasitic capacitance at a pn junction.

In order to attain the above object, a semiconductor device according to a first aspect of the present invention comprises a first semiconductor region of a first conductivity type, the first semiconductor region serving as a collector region; a second semiconductor region of the first conductivity type, the second semiconductor region being provided on the first semiconductor region and serving as a collector region whose impurity concentration is lower than that of the first semiconductor region; a third semiconductor region of a second conductivity type, the third semiconductor region being provided in the second semiconductor region and serving as a base region; and a fourth semiconductor region of the first conductivity type, the fourth semiconductor region being provided in the third semiconductor region and serving as an emitter region, wherein the second semiconductor region is thinner than a depletion layer formed in the collector region when a potential difference between the base region and the emitter region is substantially equal to a potential difference between the collector region and the emitter region.

According to the semiconductor device so constituted, a base-to-emitter voltage Vbe is almost equal to a collector-to-emitter voltage Vce in a bipolar transistor including a high-impurity-concentration region and a low-impurityconcentration region contacting the base region. In other words, the low-impurity-concentration region is set thinner than a depletion layer formed in the collector region when the base-to-collector voltage Vbc is almost 0V. In the bipolar transistor that operates on the condition that the base-to-collector voltage Vbc is almost 0V, the variation of the depletion layer when a reversed bias is applied between the base and collector can be reduced and so can be that of parasitic capacitance generated between the base and collector in the normal operation, keeping the parasitic capacitance at the same level as that of the prior art. If an oscillation circuit is constituted of the bipolar transistor, the variation of oscillation frequency of the oscillation circuit can be suppressed and the operation reliability of the oscillation circuit can be improved.

A semiconductor device according to a second aspect of the present invention comprises a first semiconductor region of a first conductivity type, the first semiconductor region serving as a collector region; a second semiconductor region of the first conductivity type, the second semiconductor region being provided on the first semiconductor region and serving as a collector region whose impurity concentration is lower than that of the first semiconductor region; a third semiconductor region of a second conductivity type, the third semiconductor region being provided in the second semiconductor region and serving as a base region; and a fourth semiconductor region of the first conductivity type, the fourth semiconductor region being provided in the third semiconductor region and serving as an emitter region, wherein the first and second semiconductor regions have an impurity-concentration profile set such that a depletion layer formed in the collector region reaches the semiconductor region when a potential difference between the base region and the emitter region is substantially equal to a potential difference between the collector region and the emitter region.

According to the semiconductor device so constituted, in a bipolar transistor including a high-impurity-concentration region in a collector region and a low-impurity-concentration region contacting a base region, an impurity-concentration profile is set such that a depletion layer formed in the collector region reaches the high-impurity-concentration region when a base-to-emitter voltage Vbe is almost equal to a collector-to-emitter voltage Vce or a base-to-collector voltage Vbc is almost 0V. With this structure, too, the same advantage as that of the semiconductor device according to the first aspect can be obtained.

A semiconductor device according to a third aspect of the present invention comprises a first semiconductor region of a first conductivity type, the first semiconductor region serving as a collector region; a second semiconductor region of the first conductivity type, the second semiconductor region being provided on the first semiconductor region and serving as a collector region whose impurity concentration is lower than that of the first semiconductor region; a third semiconductor region of a second conductivity type, the third semiconductor region being provided in the second semiconductor region and serving as a base region; and a fourth semiconductor region of the first conductivity type, the fourth semiconductor region being provided in the third semiconductor region and serving as an emitter region, wherein the second semiconductor region is thinner than a depletion layer formed in the collector region when a potential difference between the base region and the emitter region is substantially equal to a potential difference between the collector region and the emitter region, and the second semiconductor region has an impurity-concentration profile set such that impurity concentration increases in a depth direction.

According to the semiconductor device so constituted, an impurity-concentration profile is set such that the impurity concentration of the low-impurity-concentration collector of the bipolar transistor increases in the depth direction. The same advantages as those of the semiconductor devices according to the above first and second aspects can be obtained.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently embodiments of the invention, and together with the general description given above and the detailed description of the embodiments given below, serve to explain the principles of the invention.

FIG. 5A is an impurity-concentration profile set such that the impurity concentration increases linearly, FIG. 5B is an impurity-concentration profile set such that the impurity concentration increases as a higher-order function (quadric or more), and FIG. 5C is an impurity-concentration profile set such that the impurity concentration increases step by step;

DETAILED DESCRIPTION OF THE INVENTION

Figure 1:
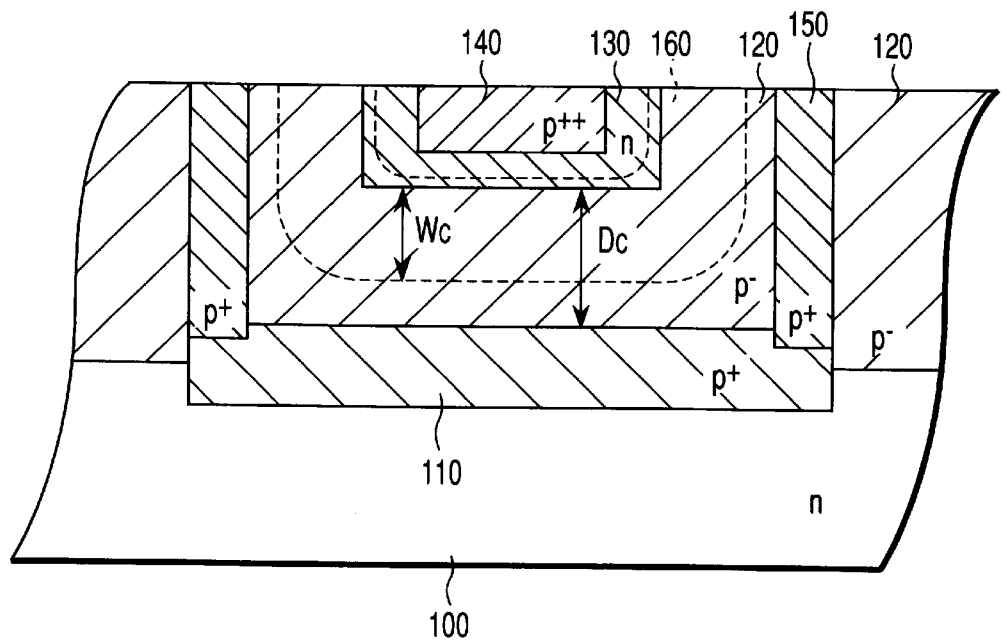
FIG. 1 is a cross-sectional view of a prior art bipolar transistor.

Embodiments of the present invention will now be described with reference to the accompanying drawings. The same reference numerals are assigned to the common constituting elements throughout the drawings and the following descriptions.

(First Embodiment)

Figure 2:
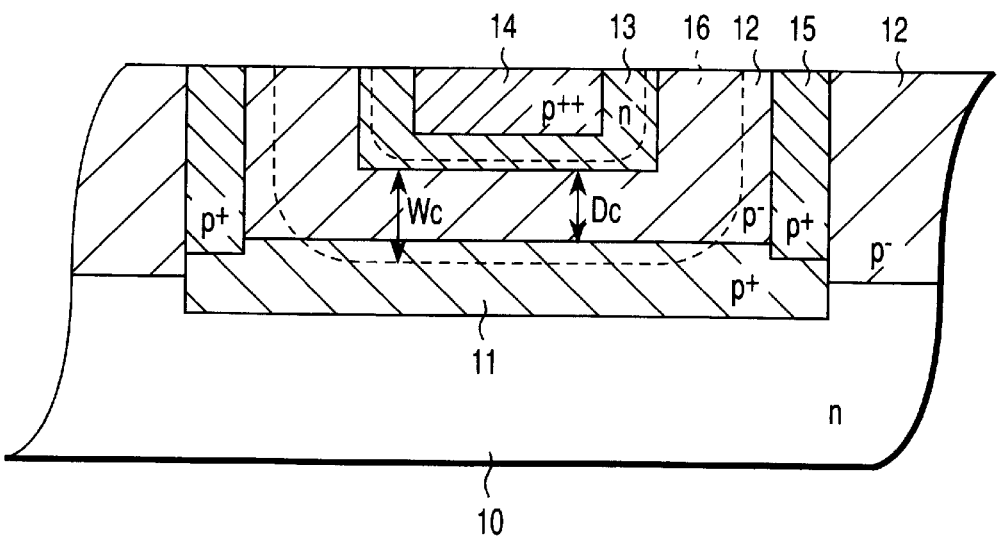
FIG. 2 is a cross-sectional view of a bipolar transistor according to a first embodiment of the present invention.

A semiconductor device according to a first embodiment of the present invention will now be described with reference to FIG. 2. FIG. 2 is a cross-sectional view of a pnp bipolar transistor of the first embodiment.

As FIG. 2 shows, a p+-type buried layer 11, which serves as a collector region, is formed in an n-type silicon substrate 10. A p−-type epitaxial silicon layer 12 is formed on the surface of the substrate 10. The layer 12 serves as a collector region whose concentration is lower than that of the p+-type buried layer 11. An n-type diffusion layer 13, which serves as a base region, is formed in a surface area of the layer 12. A p++-type diffusion layer 14, which serves as an emitter region, is formed in a surface area of the layer 13. Furthermore, two p+-type diffusion layers 15, which contact the p+-type buried layer 11, are formed in the p−-type epitaxial silicon layer 12. The bipolar transistor is thus obtained as described above.

The thickness Dc of the p−-type epitaxial silicon layer 12 is set smaller than the width (thickness) Wc of a depletion layer formed in the layer 12 by a pn junction between the p−-type epitaxial silicon layer 12 and n-type diffusion layer 13 in the normal operation.

The base-to-collector parasitic capacitance in a vertical bipolar transistor will now be described.

In the normal operation of the bipolar transistor, a reversed bias is applied to a base-to-collector pn junction or a forward bias is applied to the pn junction to such an extent that the pn junction does not turn on. The base-to-collector parasitic capacitance Cbc can thus be approximated by the following equation (1):

$$Cbc = Cbc0/(1 - Vd/\phi 0)^{1/2} \qquad (1)$$

where vd is a base-to-collector voltage, Cbc0 is parasitic capacitance obtained when the voltage Vd is equal to 0V, and $\phi 0$ is a built-in potential.

In the bipolar transistor so constituted, the impurity concentration of the collector region 12 is lower than that of the base region 13. Most part of a depletion layer 16 at the pn junction is therefore formed widely in the collector region 12. Thus, the base-to-collector parasitic capacitance almost depends upon the depletion layer formed in the collector region 12.

The parasitic capacitance can be considered to be a capacitor using both ends of the depletion layer formed between the base and collector regions as parallel flat electrodes. If a voltage applied between the base and collector regions increases, the depletion layer expands and the capacitance decreases. Under this concept, let us consider a method for determining the parasitic capacitance by calculation.

Assuming that the width of the depletion layer when a voltage Vd is applied between the base and collector regions is d(Vd), the area of a contact surface between the base and collector regions is S, and the dielectric constant of silicon is $\epsilon$, the parasitic capacitance Cbc can be represented by the following equation (2):

$$Cbc = \epsilon \times S/d(Vd) \qquad (2)$$

The width of the depletion layer is proportional to the applied voltage (reversed bias) and inversely proportional to the impurity concentration. If, therefore, the impurity concentration of the collector region is set high, the variations of the depletion layer due to the applied voltage decreases, but the width d(Vd) of the depletion layer becomes small; accordingly, the capacitance increases and varies greatly.

In the bipolar transistor of the first embodiment, the concentration of the collector region is set in such a manner that the depletion layer is formed to span both the lower- and higher-concentration layers of the collector region. The variations of the depletion layer can thus be limited to the same level as that when the collector region is formed of only the high-concentration layer, while the parasitic capacitance is limited to substantially the same level as that when the collector region is formed of only the low-concentration layer.

Figures 3A, 3B:
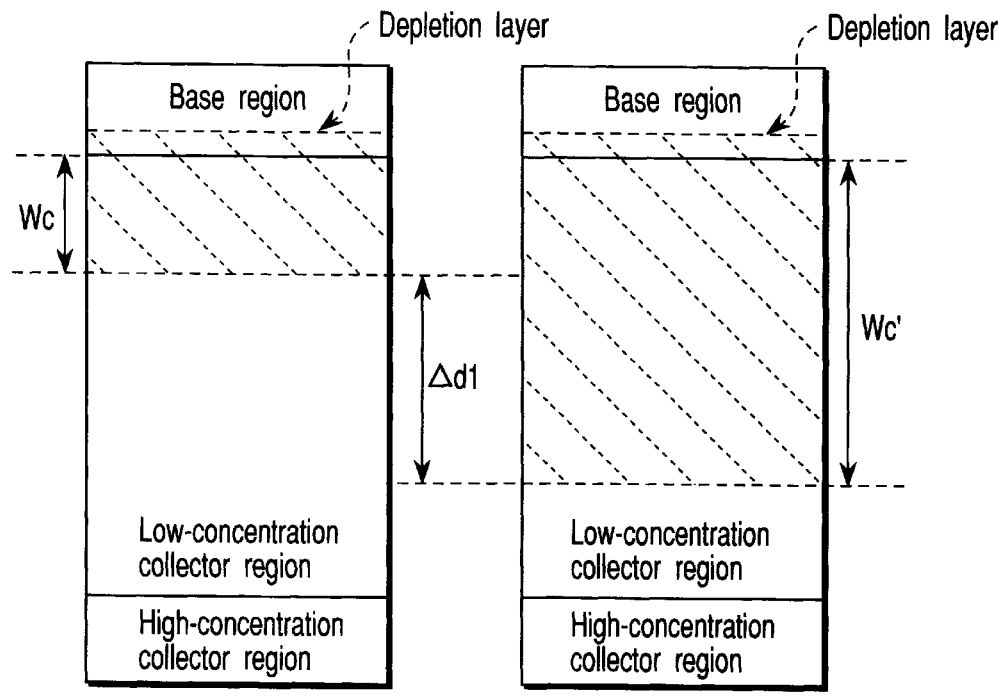
FIGS. 3A and 3B are diagrams each showing a depletion layer generated between the base and collector of the prior art bipolar transistor.
Figures 4A, 4B:
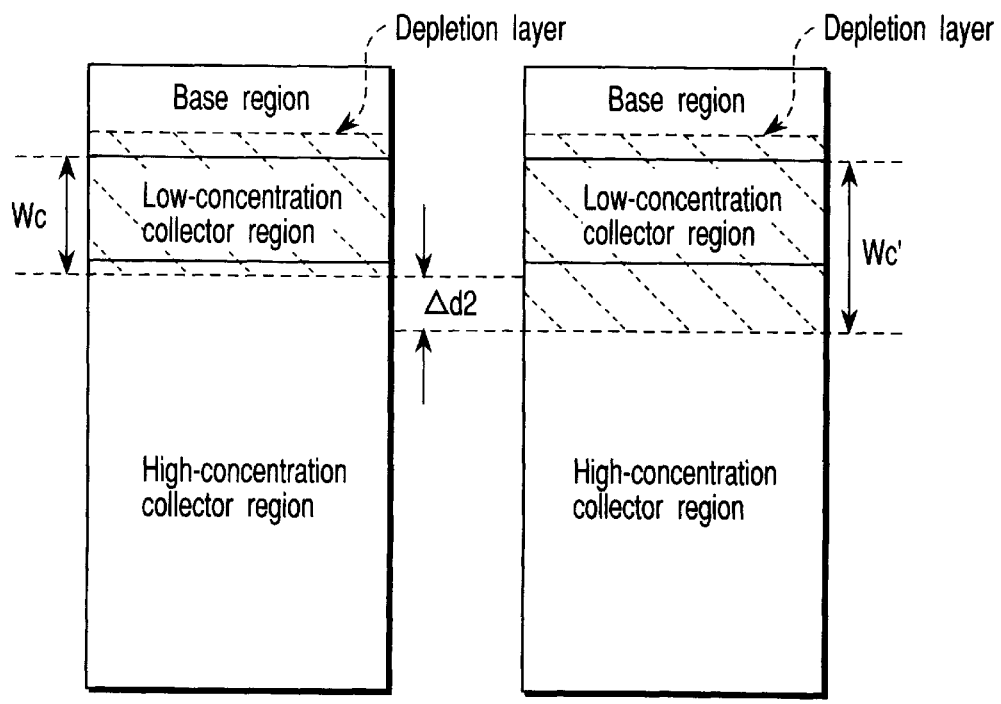
FIGS. 4A and 4B are diagrams each showing a depletion layer generated between the base and collector of the bipolar transistor according to the first embodiment of the present invention.

The above depletion layer will be described below with reference to FIGS. 3A and 3B and FIGS. 4A and 4B. FIGS. 3A and 3B illustrate a depletion layer formed between the base and collector of the prior art bipolar transistor. In FIG. 3A, the transistor performs a normal operation and, in other words, a pn junction between the base and collector turns off. In FIG. 3B, a reversed bias is applied to the pn junction. FIGS. 4A and 4B illustrate a depletion layer formed between the base and collector of the bipolar transistor according to the present invention. In FIG. 4A, the transistor performs a normal operation and, in other words, a pn junction between the base and collector turns off. In FIG. 4B, a reversed bias is applied to the pn junction.

In the prior art bipolar transistor, as shown in FIG. 3A, the width of a depletion layer formed in the collector region when a bias necessary for the normal operation is applied between the collector and emitter regions is indicated by Wc. It is needless to say that the depletion layer is all formed in a low-impurity-concentration region of the collector region.

In the bipolar transistor of the present invention, as shown in FIG. 4A, the width of a depletion layer formed in the collector region is almost equal to the width Wc of the depletion layer of the prior art bipolar transistor. However, not all the depletion layer is formed in a low-impurity-concentration region of the collector region but part of the depletion layer is included in a high-impurity-concentration region thereof. The end portions of the depletion layer are formed in the high-impurity-concentration region. Since, however, most of the depletion layer is formed in the low-impurity-concentration region, the base-to-collector parasitic capacitance is almost the same as that in the prior art bipolar transistor.

Let us consider a case where a collector-to-emitter voltage rises and a greatly reversed bias is applied between the base and collector regions. In the prior art bipolar transistor, a depletion layer having a width Wc' that increases by $\Delta d1$ is formed in the collector region, as shown in FIG. 3B. The depletion layer is so designed that it is formed only in the low-impurity-concentration region. The variations $\Delta d1$ due to the applied bias are therefore relatively wide.

According to the bipolar transistor of the present invention, it is in the high-impurity-concentration region that the depletion layer expands, as illustrated in FIG. 4B. For this reason, variations $\Delta d2$ of the width of the depletion layer due to the applied bias are less than those in the prior art bipolar transistor.

Based on the foregoing principle, the capacitance variations due to the applied voltage can greatly be decreased while suppressing the parasitic capacitance in the normal operation as in the prior art transistor.

The first embodiment is directed to a pnp bipolar transistor. Needless to say, the present invention can be applied to an npn bipolar transistor. In the bipolar transistor of the first embodiment, the base and emitter regions are formed as buried ones; however, they can be formed as epitaxial growth layers.

(Second Embodiment)

Figure 5A:
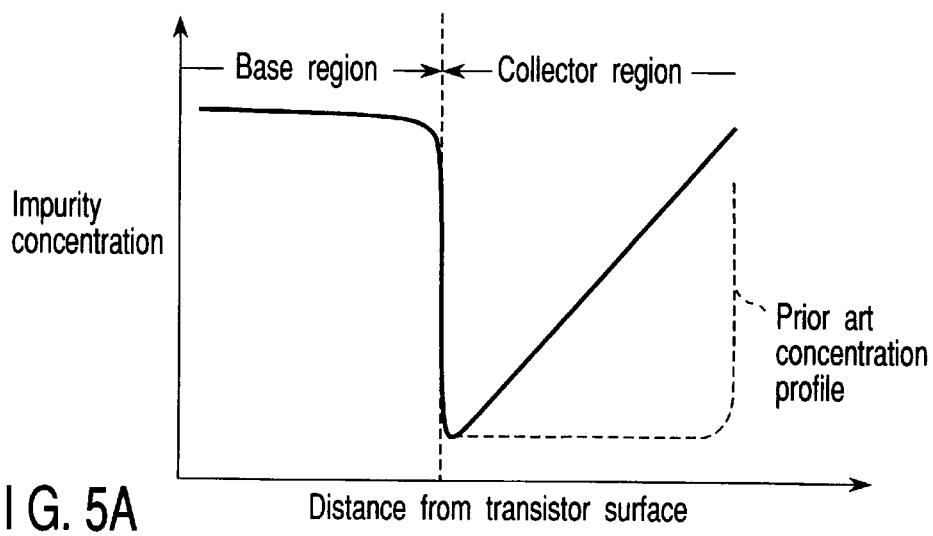
FIGS. 5A, 5B and 5C are impurity-concentration profiles along the depth direction in the base and collector regions of a bipolar transistor according to a second embodiment of the present invention and, more particularly.
Figure 5B:
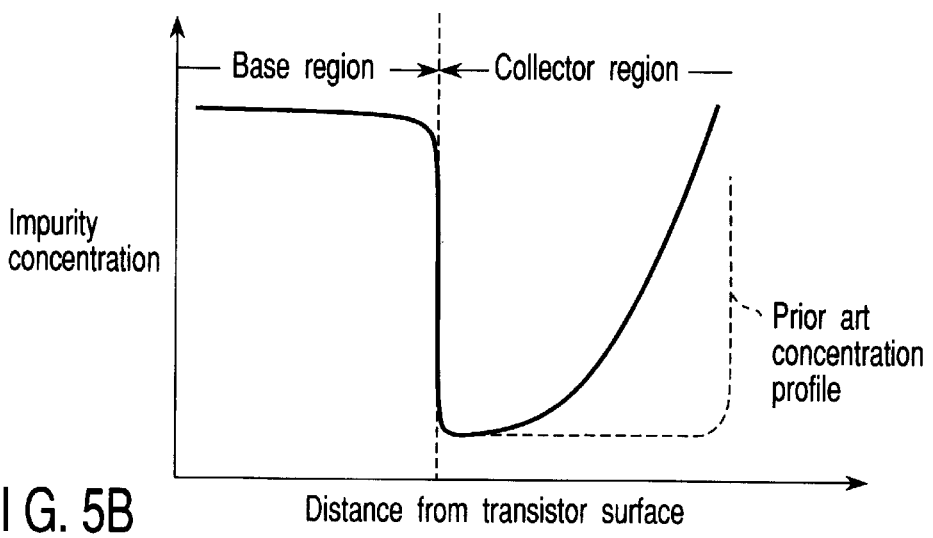
Figure 5C:
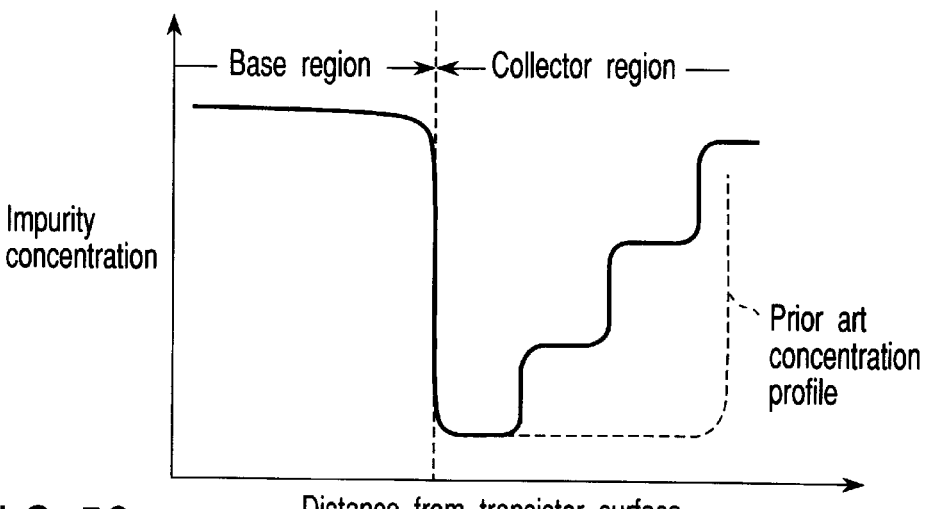

A semiconductor device according to a second embodiment of the present invention will now be described with reference to FIGS. 5A to 5C. FIGS. 5A to 5C are impurity-concentration profiles of a bipolar transistor in its depth direction.

As shown in FIGS. 5A to 5C, the second embodiment is directed to an improvement of impurity-concentration profiles in the bipolar transistor of the first embodiment. In FIG. 5A, the impurity concentration of the collector region increases linearly in its depth direction. In FIG. 5B, it increases almost quadratically. In FIG. 5C, it increases stepwise in more steps than those in the first embodiment.

If, as described above, the impurity-concentration profile is set such that the impurity concentration increases in the depth direction, the variations of the width of the depletion layer can be reduced as the reversed bias applied between the base and collector regions becomes high. In other words, the variations of the parasitic capacitance due to the applied bias can be suppressed while keeping the base-to-collector parasitic capacitance at the same level as that of the prior art bipolar transistor.

The impurity-concentration profiles are not limited to those described above. Impurity concentrations, which increase as a higher-order (quadric or more) function or an exponential function, can be adopted, provided they increase in the depth direction. Since the impurity-concentration profiles do not influence the parasitic capacitance except where the depletion layer expands, it is possible to provide a region in which the impurity concentration lowers without any problems of impedance. The above impurity-concentration profiles can be formed by ion implantation or epitaxial growth in which the impurity concentration varies step by step.

(Third Embodiment)

Figure 6:
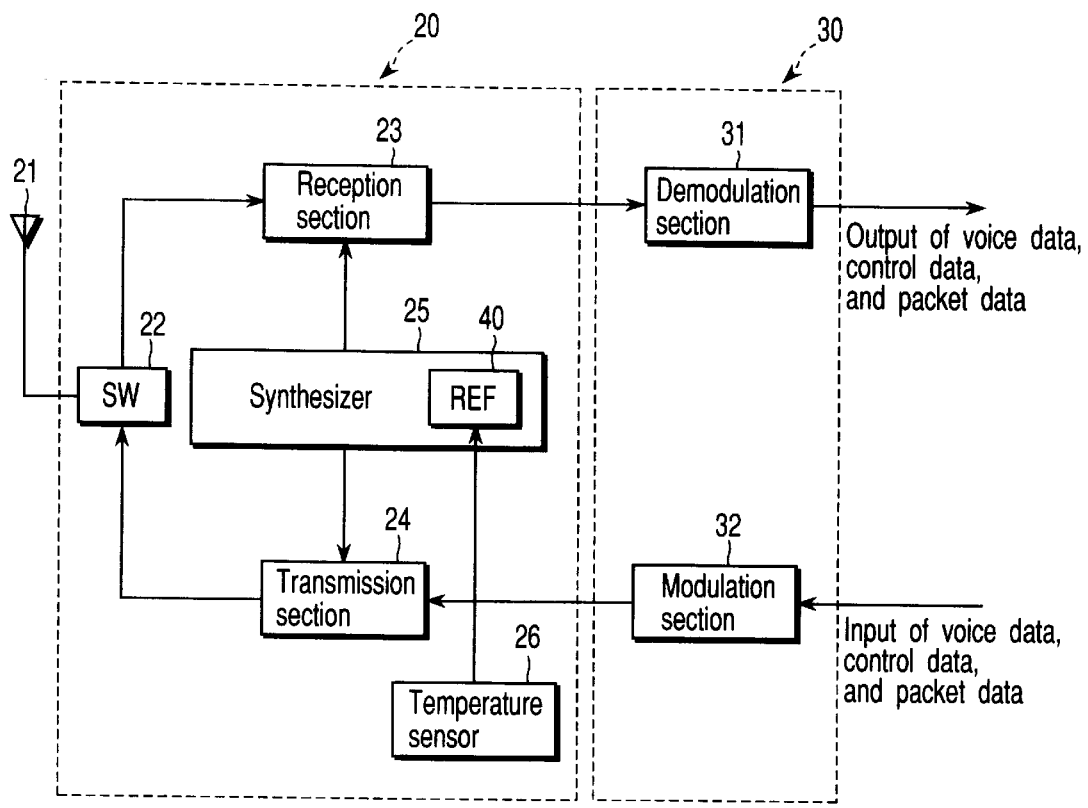
FIG. 6 is a block diagram of part of a PHS terminal according to a third embodiment of the present invention.

A semiconductor device according to a third embodiment of the present invention will now be described with reference to FIG. 6, taking a PHS (Personal Handyphone System) terminal as an example. In the third embodiment, the bipolar transistors of the first and second embodiments are applied to a reference oscillator used in the PHS terminal. FIG. 6 is a block diagram of part of the PHS terminal.

As FIG. 6 shows, the PHS terminal comprises a radio unit 20 and a modem unit 30. The radio unit 20 includes an antenna 21, a radio-frequency switch (SW) 22, a receiving section 23, a transmission section 24, a synthesizer 25, and a temperature sensor 26.

The antenna 21 receives a radio carrier signal from a base station (not shown) and then supplies it to the reception section 23 through the radio-frequency switch 22 of the radio unit 20. In the reception section 23, the radio carrier signal is mixed with a reference oscillation signal generated from the synthesizer 25 and then down-converted to a receiving intermediate-frequency signal.

The intermediate-frequency signal is supplied from the reception section 23 to a demodulation section 31 of the modem unit 30. The demodulation section 31 digitally demodulates the intermediate-frequency signal to reproduce a digital demodulation signal.

After that, the digital demodulation signal is separated into data for each reception time slot. When the data is packet data or control data, it is analyzed by a data communication section (not shown) and displayed on a display section of the PHS. When the data is voice data, it is decoded by a call unit (not shown) and converted into an analog signal, and the analog signal is output from a speaker.

On the other hand, a voice signal of a user of the PHS terminal, which is supplied from a microphone, is subjected to PCM (Pulse Code Modulation) coding and compression coding in the call unit (not shown). The coded voice data and the control data and packet data supplied from the data communication section are multiplexed and input to a modulation section 32 of the modem unit 30.

The modulation section 32 digitally modulates a transmitting intermediate-frequency signal by the input multiplexed digital communication signal and supplies the modulated intermediate-frequency signal to the transmission section 24.

In the transmission section 24, the modulated intermediate-frequency signal is mixed with the reference oscillation signal generated from the synthesizer 25 and up-converted to a radio carrier frequency. The up-converted signal is amplified to a given transmission/reception power level. A radio carrier signal output from the transmission section 24 is transmitted to the base station (not shown) from the antenna 21 via the radio-frequency switch 22.

The temperature sensor 26 in the radio unit 20 corrects an oscillation frequency of a reference oscillator (REF) 40 provided in the synthesizer 25 in accordance with ambient temperatures.

Figure 7:
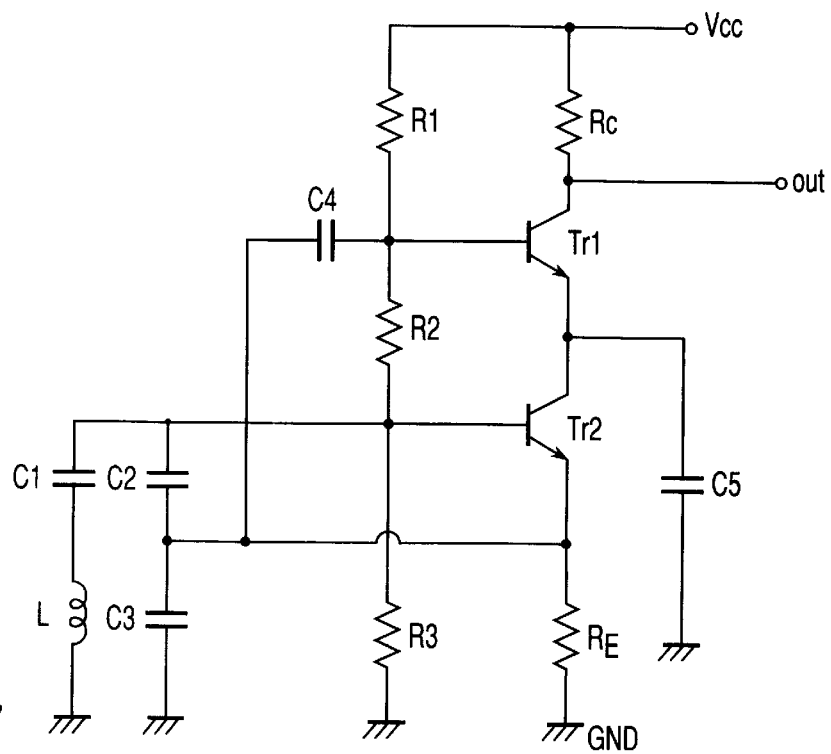
FIG. 7 is a circuit diagram of a reference oscillator of the PHS terminal according to the third embodiment of the present invention.

FIG. 7 illustrates an example of the circuit arrangement of the reference oscillator 40.

Referring to FIG. 7, a resistance element Rc, npn bipolar transistors Tr1 and Tr2, and a resistance element $R_E$ are connected in series between a power supply potential Vcc and a ground potential GND. Resistance elements R1 to R3, which serve as bias resistors of the transistors Tr1 and Tr2, are connected in parallel with the resistance element Rc, transistors Tr1 and Tr2, and a resistance element $R_E$.

An LC oscillation circuit is connected to the base of the transistor Tr2. As shown, the LC oscillation circuit includes a capacitor C1 and an inductor L connected in series and capacitors C2 and C3 connected in series. A connection node between the capacitors C2 and C3 is connected to a connection node between the emitter of the transistor Tr2 and the resistance element $R_E$. The connection node between the capacitors C2 and C3 is also connected to a connection node between the resistance elements R1 and R2 through a capacitor C4. A capacitor C5 is connected between the ground potential GND and a connection node between the emitter of the transistor Tr1 and the collector of the transistor Tr2. A connection node between the collector of the transistor Tr1 and the resistance element Rc serves as an output terminal.

The reference oscillator so constituted generates a reference oscillation signal that is required when the radio carrier signal is down-converted into a receiving intermediate-frequency signal or when the transmitting intermediate-frequency signal is up-converted into a radio carrier signal. Thus, a precise oscillation frequency and a high degree of reliability are needed for the reference oscillator. The importance in this case is parasitic capacitance between the base and collector of the bipolar transistor Tr2. The power supply for supplying the power supply potential Vcc is mainly a battery. The power supply potential Vcc therefore drops due to a call and data communications. If the base-to-collector capacitance of the bipolar transistor Tr2 is varied with a change of the power supply potential Vcc, the oscillation frequency is varied.

In the third embodiment, the foregoing structures of the first and second embodiments are applied to the bipolar transistor Tr2 constituting the reference oscillator.

In the PHS terminal, the power supply potential Vcc in itself is set low by request for low-voltage driving. The condition of normal operations of the bipolar transistor Tr2 is expressed as follows: Vbc is almost equal to 0V or Vbe is equal to Vce. The width of a low-concentration layer has only to decrease more than that of a depletion layer formed when Vbc=0V. Specifically, in the radio-frequency reference oscillator used in the PHS terminal, the width of a depletion layer formed in the collector region is about 300 Å under conditions that the impurity concentration of the low-concentration collector region is $1.5\times10^{16}$ cm$^{-2}$ and Vbc is equal to 0V. Thus, the thickness of the low-concentration collector region has only to be set at 300 Å or less. The variations of parasitic capacitance due to a decrease of the power supply potential Vcc can be suppressed while keeping the base-to-collector parasitic capacitance at the same level as that of the parasitic capacitance in the prior art, and the operation reliability of the reference oscillator can be improved, as can be that of the PHS terminal.

The present invention is not limited to the above embodiments but can widely be applied to devices in which the parasitic capacitance depending upon a depletion layer formed at a pn junction becomes a problem. The bipolar transistors of the above embodiments are used not only in PHS terminals but also in all oscillation circuits constituted using bipolar transistors.

Various modifications to the above embodiments can be made without departing from the scope of the subject Matter of the present invention. The above embodiments include inventions in varying stages. Various inventions can be created by appropriate combinations of a plurality of constituting elements disclosed in the embodiments. Even though some constituting elements are deleted from the embodiments, the remaining constituting elements can be extracted as an invention when the object of the invention can be attained and the advantage of the invention can be obtained.

The above-described present invention provides a semiconductor device that is capable of suppressing variations of the depth of a depletion layer due to an applied voltage while decreasing the parasitic capacitance at a pn junction.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A bipolar transistor used in an oscillation circuit, comprising:
   a first semiconductor region of a first conductivity type, the first semiconductor region serving as a collector region;
   a second semiconductor region of the first conductivity type, the second semiconductor region being provided on the first semiconductor region and serving as a collector region whose impurity concentration is lower than that of the first semiconductor region;
   a third semiconductor region of a second conductivity type, the third semiconductor region being provided in the second semiconductor region and serving as a base region; and
   a fourth semiconductor region of the first conductivity type, the fourth semiconductor region being provided in the third semiconductor region and serving as an emitter region,
   wherein the second semiconductor region is thinner than a depletion layer formed in the collector region when a potential difference between the base region and the emitter region is substantially equal to a potential difference the collector region and the emitter region.

2. The semiconductor device according to claim 1, further comprising a fifth semiconductor region formed in the second semiconductor region to contact the first semiconductor region, the fifth semiconductor region having impurity concentration that is higher than that of the second semiconductor region.

3. The semiconductor device according to claim 1, wherein the first semiconductor region is a buried layer and the second semiconductor region is an epitaxial layer formed by epitaxial growth.

4. The semiconductor device according to claim 1, wherein the third semiconductor region and the fourth semiconductor region are buried layers.

5. A bipolar transistor used in an oscillation circuit, comprising:
   a first semiconductor region of a first conductivity type, the first semiconductor region serving as a collector region;
   a second semiconductor region of the first conductivity type, the second semiconductor region being provided on the first semiconductor region and serving as a collector region whose impurity concentration is lower that of the first semiconductor region;
   a third semiconductor region of a second conductivity type, the third semiconductor region being provided in the second semiconductor region and serving as a base region; and
   a fourth semiconductor region of the first conductivity type, the fourth semiconductor region being provided in the third semiconductor region and serving as an emitter region,
   wherein the first and second semiconductor regions have an impurity-concentration profile set such that a depletion layer formed in the collector region reaches the first semiconductor region when a potential difference between the base region and the emitter region is substantially equal to a potential difference between the collector region and the emitter region.

6. The semiconductor device according to claim 5, further comprising a fifth semiconductor region formed in the second semiconductor region to contact the first semiconductor region, the fifth semiconductor region having impurity concentration that is higher than that of the second semiconductor region.

7. The semiconductor device according to claim 5, wherein the first semiconductor region is a buried layer and the second semiconductor region is an epitaxial layer formed by epitaxial growth.

8. The semiconductor device according to claim 5, wherein the third semiconductor region and the fourth semiconductor region are buried layers.

9. A bipolar transistor used in an oscillation circuit, comprising:
   a first semiconductor region of a first conductivity type, the first semiconductor region serving as a collector region;
   a second semiconductor region of the first conductivity type, the second semiconductor region being provided on the first semiconductor region and serving as a collector region whose impurity concentration is lower than that of the first semiconductor region;
   a third semiconductor region of a second conductivity type, the third semiconductor region being provided in the second semiconductor region and serving as a base region; and
   a fourth semiconductor region of the first conductivity type, the fourth semiconductor region being provided in the third semiconductor region and serving as an emitter region, wherein the second semiconductor region is thinner than a depletion layer formed in the collector region when a potential difference between the base region and the emitter region is substantially equal to a potential difference between the collector region and the emitter region, and the second semiconductor region has an impurity-concentration profile set such that impurity concentration increases in a depth direction.

10. The semiconductor device according to claim 9, wherein the impurity-concentration profile of the second semiconductor region is set such that the impurity concentration increases as a linear function in the depth direction.

11. The semiconductor device according to claim 9, wherein the impurity-concentration profile of the second semiconductor region is set such that the impurity concentration increases as a higher-order function in the depth direction.

12. The semiconductor device according to claim 9, wherein the impurity-concentration profile of the second semiconductor region is set such that the impurity concentration increases step by step in the depth direction.

13. The semiconductor device according to claim 9, further comprising a fifth semiconductor region formed in the second semiconductor region to contact the first semiconductor region, the fifth semiconductor region having impurity concentration that is higher than that of the second semiconductor region.

14. The semiconductor device according to claim 9, wherein the first semiconductor region is a buried layer and the second semiconductor region is an epitaxial layer formed by epitaxial growth.

15. The semiconductor device according to claim 9, wherein the third semiconductor region and the fourth semiconductor region are buried layers.

* * * * *